(12) United States Patent
Reber et al.

(10) Patent No.: US 6,597,234 B2
(45) Date of Patent: Jul. 22, 2003

(54) ANTI-FUSE CIRCUIT AND METHOD OF OPERATION

(75) Inventors: Douglas M. Reber, Austin, TX (US); Stephen R. Crown, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/017,429

(22) Filed: Dec. 14, 2001

(65) Prior Publication Data

US 2003/0112055 A1 Jun. 19, 2003

(51) Int. Cl.[7] .............................................. H01H 37/76
(52) U.S. Cl. ................... 327/525; 327/567; 365/225.7; 361/56
(58) Field of Search .................. 327/525, 567; 326/38; 365/225.7, 185.18, 189.03; 361/56, 91.1, 111, 118

(56) References Cited

U.S. PATENT DOCUMENTS

| | | | | |
|---|---|---|---|---|
| 5,315,177 A | * | 5/1994 | Zagar et al. | 326/44 |
| 5,442,589 A | * | 8/1995 | Kowalski | 365/225.7 |
| 5,844,298 A | * | 12/1998 | Smith et al. | 257/530 |

OTHER PUBLICATIONS

Alavi et al., "A PROM Element Based on Salicide Agglomeration of Poly Fuses in a CMOS Logic Process," IEEE International Electron Devices Meeting, Dec. 1997, 4 pgs.
Chiba et al., "Application of Field Programmable Gate Arrays to Space Projects," Proceedings Third ESA Electronic Components Conference, ESTEC, Noordwijk, The Netherlands, pp. 471–474 (1997).

Comer, "Zener Zap Anti-Fuse Trim in VLSI Circuits," VLSI Design, vol. 5, No. 1, pp. 89–100 (1996).
Cho et al., "A New Field Programmable Gate Array: Architecture and Implementation," ETRI Journal, vol. 17, No. 2, pp. 21–30 (1995).
"Technology Focus A Reflow Model for the Anti-Fuse," Electronic Engineering, pp. 31–40 (1991).
"IBM Technical Disclosure Bulletin," vol. 27, No. 10A, pp. 5715–5716, Mar. 1985.

* cited by examiner

Primary Examiner—Tuan T. Lam
Assistant Examiner—Hiep Nguyen
(74) Attorney, Agent, or Firm—James L. Clingan, Jr.; Joanna G. Chiu

(57) ABSTRACT

An anti-fuse useful in implementing redundancy in a memory utilizes a normal transistor characteristic that is generally considered undesirable in order to provide two easily detected states. The un-programmed state, which is the high impedance state, is achieved simply with a normal transistor in its non-conductive state. The programmed state, which is the low impedance state, is achieved by forcing a normal transistor to conduct current through its gate. This causes the gate dielectric to become permanently conductive. This programmed transistor then is conductive between its source and drain that is easily differentiated from the transistor that is held in its non-conductive state. The result is a fuse technology using an anti-fuse that provides for easily distinguishable programmed and un-programmed states achieved by electrical programming rather than by laser programming.

10 Claims, 1 Drawing Sheet

ANTI-FUSE CIRCUIT AND METHOD OF OPERATION

FIELD OF THE INVENTION

This invention relates to integrated circuits and more particularly to fusing techniques including anti-fuse circuits useful in integrated circuits.

RELATED ART

It is common in memory integrated circuits to have redundancy that is implemented using fuse technology. The fuse technology is required in order to replace redundant rows or columns with rows and columns from the regular array that have been found to be defective. With more modern technology utilizing copper as the interconnect layers, especially at the higher levels in the integrated circuit, there have been found to be difficulties in using copper fuses. The last layer of copper is typically the thickest. When a laser is utilized to blow a copper fuse at this thicker level, there is some difficulty in blowing the fuse because the laser pulse is absorbed by only the upper portion of the copper, and the rest of the copper is blown by heat from conduction. Because of the requirement or the result that conduction is involved in blowing the fuse, there have been difficulties in ensuring that the entire copper line has been completely opened. Another difficulty in blowing copper is that it has a high degree of reflection so that very high intensity is required for the laser. Inherent in the copper blowing process is that it requires additional expense.

Another technique is to electrically blow polysilicon. Typical polysilicon has a salicide over the top of it that is difficult to blow completely. This technique relies on a change in resistance that is not nearly as great as that between something that is a short and an open. In the case of the salicide covered polysilicon the change in resistance that occurs may be difficult to detect.

Thus there is a need for a fuse technology which is compatible with the most advanced interconnect technologies and does not have the problems associated with polysilicon.

DESCRIPTION OF THE INVENTION

An anti-fuse is achieved by using a fuse transistor as a normal transistor in its non-conductive state as a high impedance state for an un-programmed condition and using the anti-fuse transistor that has had its gate dielectric forced into a conductive condition as a low impedance as the programmed state. This programmed state is achieved by applying a relatively high voltage to the gate of the fuse transistor to cause it to be programmed and thus to be permanently conductive. The anti-fuse transistor is held in a non-conductive condition to provide the un-programmed state. A circuit coupled to the anti-fuse transistor generates a signal to indicate the state of the fuse transistor. This signal can then be used to implement a function such as redundancy in a memory.

Figure 1:
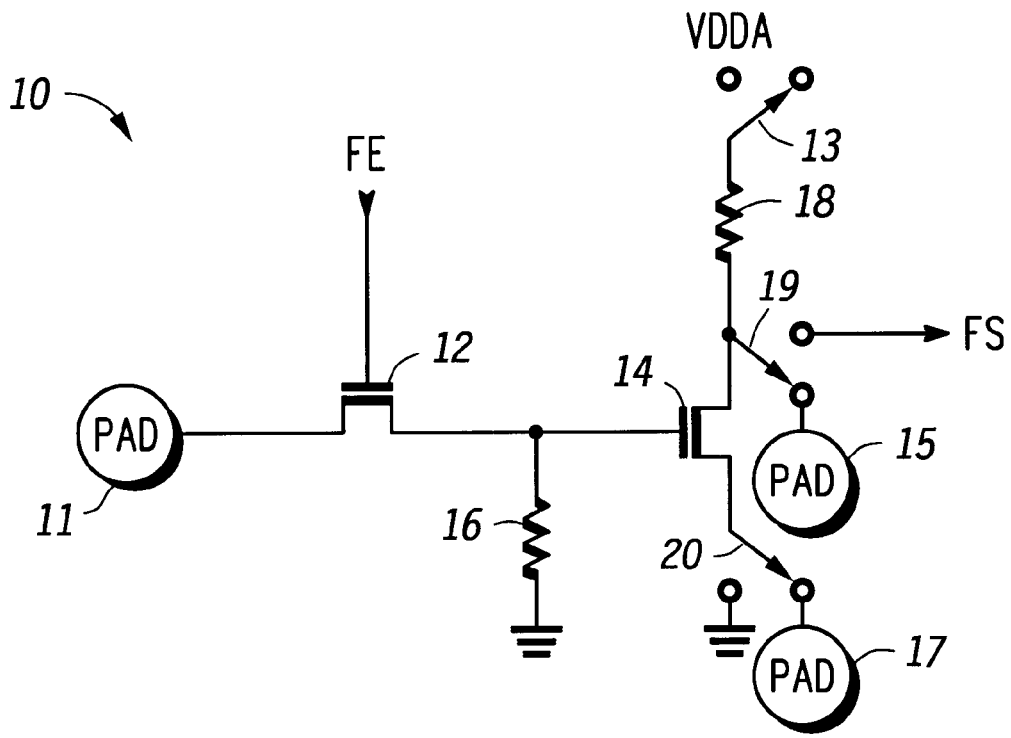
FIG. 1 is a diagram of a circuit according to a preferred embodiment of the present invention.
Figure 2:
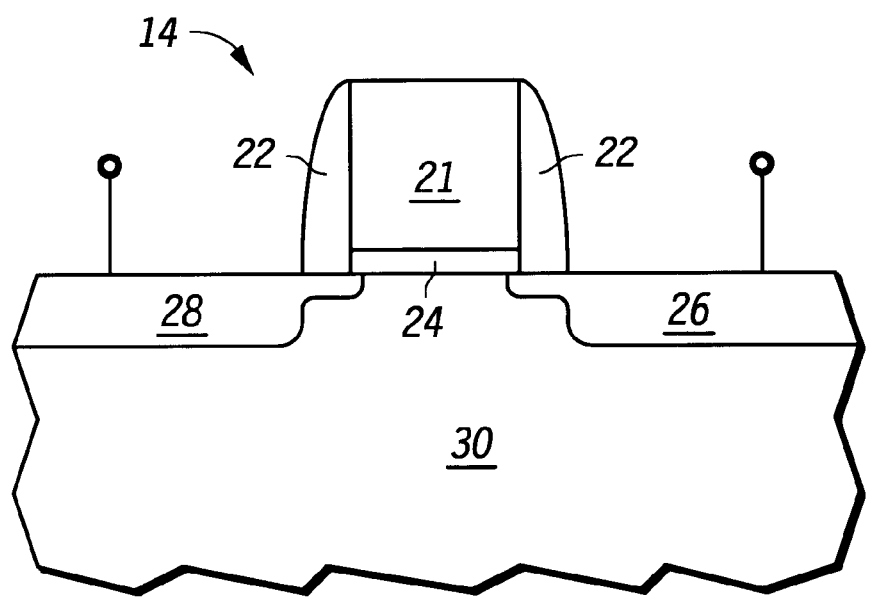
FIG. 2 is a cross-section of a transistor device used in the circuit of FIG. 1.

Shown in FIG. 1 is an anti-fuse circuit 10 comprising a pad 11, a transistor 12, a switch 13, a transistor 14, a pad 15, a resistor 16, a pad 17, a resistor 18, a switch 19, and a switch 20. Transistor 12 has a gate for receiving a fuse enable signal FE, a first current electrode connected to pad 11, and a second current electrode. These first and second electrodes are interchangeable as source and drain. Resistor 16 has a first terminal connected to the second current electrode of transistor 12, and a second terminal coupled to a negative power supply shown in FIG. 1 as ground. Transistor 14 has a gate connected to the second terminal of resistor 16, a source connected to switch 20, and a drain connected to switch 19. Resistor 18 has a first terminal connected to switch 13 and a second terminal connected to the drain of transistor 14. Switch 13 switches the first terminal of resistor 18 between an open condition and a power supply VDDA. VDDA is representative of a power supply voltage useful for a memory array but could be another chosen voltage useful as a power supply voltage. This voltage is typically the lowest power supply voltage on the chip and may be generated from a larger power supply voltage useful for providing power to peripheral circuits such as output buffers. Switch 19 switches the drain of transistor 14 between pad 15 and to an output terminal providing output signal fuse sense. Switch 20 switches the source of transistor 14 between pad 17 and ground.

Switches 13, 19, and 20, which are simply shown as switches, would be implemented as transistors, are switched to the condition in which the programming of transistor 14 may occur. Transistor 14 has a relatively thin gate dielectric. The thinnest gate dielectric is typically chosen for the fastest transistors of the internal circuitry of the particular integrated circuit in which it is to be utilized. Such a gate dielectric may be 18 angstroms, for example, based on current technology. Transistor 14 thus operates as a normal transistor and can be switched between a conductive and a non-conductive state. It is shown as an n-channel transistor, which is non-conductive when its gate receives a logic low and is conductive when its gate receives a logic high. For programming of transistor 14, pad 11 receives a relatively high voltage and signal FE is also at a relatively high voltage. These voltages may be, for example, in the 3.3 to 7 volt range. Transistor 12 is thus conductive and couples pad 11 to the gate of transistor 14. The gate voltage on transistor 14 will thus be the voltage of signal FE less the threshold voltage of transistor 12 in that condition. The voltages selected for pad 11 and signal FE are sufficient so that transistor 14 will be degraded and will actually provide conduction between its gate and its source or drain or both. To create a conductive path from the gate of transistor 14 to its source, pad 17 is coupled to ground. Pad 15 may be left floating. In such case a current is conducted between the gate of transistor 14 and the source of transistor 14. This has a permanent effect on the gate dielectric of transistor 14 and results in a permanent conduction path between the gate and source.

This creation of a conductive path is a degradation of the gate dielectric that is generally considered undesirable but is used to advantage in this application. Similarly, to create a conductive path between the gate and drain of transistor 14, pad 15 is coupled to ground and pad 17 is left floating. Current thus flows between the gate and drain of transistor 14 causing permanent damage and a permanent conduction path. Thus transistor 14 in its programed condition has a conduction path between its drain and gate and between its gate and source. The result then is there is a conduction path between the drain and source of transistor 14 by way of the gate dielectric of transistor 14.

To read the state of transistor 14, switches 13, 19, and 20 are switched to VDDA, FS, and ground, respectively. This is the case in which circuit 10 would be useful in actually assisting in the implementation of redundancy, for example. In such condition, if transistor 14 is programmed, it provides a conduction path from VDDA through resistor 18, through the gate and drain of transistor 14, and thus through resistor 16. In addition, there is also a current path through resistor 18, through the drain to source of transistor 14, and thus to ground. Thus from the drain of transistor 14 there are two conduction paths to ground, one through resistor 16 and one through transistor 14, itself. This results in a current flow that drops significant voltage across resistor 18. Resistor 18 is preferably of relatively high resistance compared to that of the conduction through transistor 14. Thus signal FS provides a voltage output that is significantly below that of VDDA. For the case where transistor 14 is un-programmed, and thus is a normal transistor, and its state is to be detected, resistor 16 ensures that the gate of transistor 14 is coupled to ground, and transistor 14 is non-conductive. With transistor 14 non-conductive, resistor 18 has minimal current flowing through it and thus does not drop much voltage. Thus signal FS is at or very near VDDA. Thus signal FS provides a signal at or near VDDA for the case where transistor 14 is in an un-programmed state and provides a voltage that is significantly lower than that for the case when transistor 14 is programmed. During the sensing operation, pads 11, 15, and 17 are simply floating and are not relevant to the operation of the circuit, signal FE is provided as the logic low to transistor 12 during the condition in which circuit 10 is providing an output of signal FS which is indicative of the state of fuse transistor 14. The condition of transistor 12, however, is not particularly significant during this read mode because pad 11 is floating.

Pads 11, 15 and 17 may be in common with many fuses and may either be simply probe pads or may also be connected to external pins of the integrated circuit. Signal FE then performs the selection as to which fuses are to be programmed and which are to remain un-programmed. Thus each fuse would have a unique signal FE but pads 11, 15, and 17 would be in common with all of the fuses. Transistor 12 needs to be able to withstand significantly higher voltages than transistor 14 is capable of handling. A typical way this would be done is for transistor 12 to have a gate dielectric that is significantly thicker than that of transistor 14. These typically occur in an integrated circuit for those transistors that are utilized in the peripheral circuitry, which includes output buffers, for example. Thus it is common for an integrated circuit to have transistors of more than one gate dielectric thickness in order to be able to withstand differing voltage requirements and provide different operational characteristics. Thus there is typically no special requirement for providing special devices to implement the circuit of FIG. 1. Transistor 14 would be of the kind normally made, as would transistor 12. Of course there are many alternative ways of sensing the state of transistor 14, as well as there may be other ways of programming it to achieve a conductive gate dielectric.

Circuit 10 provides for ensuring that the portion of the gate dielectric between the source and gate and the portion of the gate dielectric between the drain and gate become permanently conductive. This ensures having a conductive path from the drain to the gate through the altered gate dielectric, through the other side of the gate adjacent to the drain, and then from the gate to the source through the altered gate dielectric. A variation in programming circuit 10 is to just drive current between the gate and drain. In such case, in the read condition, current would flow through resistor 18, drain to gate of a transistor 14, and then through resistor 16. In such case it would not be necessary to drive current from the gate to the source of transistor 14. This may result in less variation between the programmed and un-programmed states.

An alternative to the approach shown in FIG. 1 for programming is to drive current through gate dielectric 24 to substrate 30 to cause the portion of gate dielectric 24 that is between source 28 and drain 26 to become permanently conductive. In such case, some conductive portion would need to overlap drain 26 and/or source 28 sufficiently to provide the necessary conduction to drain 26. In such case the substrate could provide the current path from drain to ground.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed.

What is claimed is:

1. An anti-fuse circuit, comprising:
   an anti-fuse transistor operable as a normal transistor in a un-programmed condition and operable as a degraded transistor in a programmed condition, wherein the programmed condition is characterized by the degraded transistor having a first permanently conductive gate dielectric portion between a gate and a source and a second permanently conductive gate dielectric portion between the gate and a drain; and
   a sensing output, coupled to the anti-fuse transistor, for providing a first sensing output value during the un-programmed condition and a second sensing output value during the programmed condition.

2. The anti-fuse circuit of claim 1, further comprising:
   anti-fuse enable circuitry, coupled to the anti-fuse transistor, for selectively coupling a supply voltage to the anti-fuse transistor.

3. The anti-fuse circuit of claim 2, wherein the anti-fuse transistor comprises a transistor having a dielectric breakdown voltage, and wherein the supply voltage exceeds the dielectric breakdown voltage by an amount sufficient to form the first and second permanently conductive gate dielectric portions.

4. A method of operating an anti-fuse circuit, comprising:
   enabling anti-fuse enabling circuitry coupled to an anti-fuse transistor having a gate electrode, a gate dielectric, a first current electrode, and a second current electrode; and
   forming a degraded transistor from the anti-fuse transistor, wherein forming comprises:
     applying a first voltage differential, via the anti-fuse enabling circuitry, for a first time period, between the gate electrode and the first current electrode sufficient to cause a first portion of the gate dielectric to become permanently conductive; and
     applying a second voltage differential, via the anti-fuse enabling circuitry, for a second time period, between the gate electrode and the second current electrode sufficient to cause a second portion of the gate dielectric to become permanently conductive.

5. The method of claim 4, wherein prior to enabling the anti-fuse enabling circuitry, the anti-fuse transistor is operable as a normal transistor in a un-programmed state.

6. The method of claim 4, wherein the degraded transistor has a conductive permanent conductive path between the first and second current electrodes.

7. The method of claim 6 wherein the second current electrode is floating during the first time period, and the first current electrode is floating during the second time period.

8. An anti-fuse circuit, comprising:

an anti-fuse transistor having a gate electrode, a first current electrode and a second current electrode and capable of operating in a un-programmed state or a programmed state; and anti-fuse enabling circuitry having a first terminal coupled to first current electrode, second terminal coupled to second current electrode, and a third terminal coupled to the gate electrode of the anti-fuse transistor, the anti-fuse enabling circuitry applying a first voltage differential between the gate electrode and the first current electrode and a second voltage differential between the gate electrode and the second current electrode of the anti-fuse transistor to form a degraded transistor having permanently conductive gate dielectric portions, the degraded transistor corresponding to the programmed state of the anti-fuse transistor.

9. The anti-fuse circuit of claim 8, further comprising:

a sensing output coupled to the first current electrode of the anti-fuse transistor, the sensing output providing a first output value when the anti-fuse transistor is operating in the un-programmed state and a second output value when the anti-fuse transistors is operating in the programmed state.

10. The anti-fuse circuit of claim 9, wherein the first current electrode of the anti-fuse transistor is coupled to a second voltage supply and the second current electrode of the anti-fuse transistor is coupled to a third voltage supply.

* * * * *